(12) United States Patent
Ghosh et al.

(10) Patent No.: US 6,569,579 B2
(45) Date of Patent: May 27, 2003

(54) SEMICONDUCTOR MASK ALIGNMENT SYSTEM UTILIZING PELLICLE WITH ZERO LAYER IMAGE PLACEMENT INDICATOR

(75) Inventors: Amit Ghosh, Singapore (SG); Yew Kong Tan, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 58 days.

(21) Appl. No.: 09/805,846

(22) Filed: Mar. 13, 2001

(65) Prior Publication Data

US 2002/0132172 A1 Sep. 19, 2002

(51) Int. Cl.$^7$ .................................................. G03F 9/00
(52) U.S. Cl. .............................. 430/5; 430/22; 257/797; 438/975
(58) Field of Search .......................... 430/5, 22; 355/18; 257/797; 438/975

(56) References Cited

U.S. PATENT DOCUMENTS 5,837,404 A * 11/1998 La ................................ 430/5
6,221,541 B1 * 4/2001 Ogusu et al. ................... 430/5

* cited by examiner

Primary Examiner—Christopher G. Young
(74) Attorney, Agent, or Firm—Mikio Ishimaru

(57) ABSTRACT

An exposure apparatus is provided for a semiconductor wafer, which includes a light source, a body containing the light source, and an illumination optical system for directing light from the light source to the semiconductor wafer. A holder in the body holds a reticle and a zero layer reticle is disposed between the illumination optical system and the light source for masking light from the light source. The zero layer reticle has a pellicle frame and a pellicle film with a zero layer image placement indicator thereon.

17 Claims, 3 Drawing Sheets

SEMICONDUCTOR MASK ALIGNMENT SYSTEM UTILIZING PELLICLE WITH ZERO LAYER IMAGE PLACEMENT INDICATOR

TECHNICAL FIELD

The present invention relates generally to the manufacture of semiconductor devices and more particularly to semiconductor wafer and photomask alignment.

BACKGROUND ART

In recent years, semiconductor devices such as integrated circuits and large scale integrated circuits have decreased in size and increased in density such that higher accuracy has been required of the manufacturing equipment, and particularly the exposure equipment, in which the circuit pattern of a mask or a reticle is transferred onto a semiconductor wafer. Photo-patterning of the wafers requires precise positioning of a reticle or mask relative to the wafer being processed. To achieve such precise positioning, the exact orientation or location of the wafer must be known such that the mask can be precisely placed. This is typically accomplished by moving the wafer beneath fixed optics, which rely on photosensors to determine the wafer's precise location relative to a table on which the wafer rests and moves relative to the optics. The optics are directed toward the wafer to determine location of predetermined patterns provided in the wafer at at least two discrete locations, such that wafer orientation is determined. With such known, the photomask and wafer can be precisely positioned in a desired relative orientation for processing.

After positioning, a photosensitive material deposited on the wafer is exposed to light or radiation to transfer the pattern of the photomask to the wafer. In step-and-repeat type equipment in which each exposure helps in the formation of a layer of a chip, the wafer is caused to effect stepping by a predetermined distance and then the circuit pattern of the mask is again exposed. Particularly in reduction projection type exposure equipment (steppers), have become the main current of the exposure apparatuses of this kind. In this step-and-repeat system, the wafer is placed on a two-dimensionally movable stage and positioned relative to the projected image of the circuit pattern of the mask and therefore, the projected image and each chip on the wafer can be precisely superposed one upon the other. Also, in the case of the reduction projection type exposure apparatus, there are two methods, namely, the through-the-lens type alignment method in which alignment marks provided on a mask or a reticle and marks attendant to the chips on a wafer are directly observed or detected through a projection lens to thereby accomplish alignment, and the off-axis type alignment method in which alignment of an entire wafer is effected by the use of an alignment microscope provided at a predetermined distance from a projection lens and the wafer is fed to just beneath the projection lens. Generally, the through-the-lens system has a merit that the super-position accuracy is high because alignment is effected for each chip on the wafer, but suffers from a problem that the exposure processing time of a wafer is long. In the case of the off-axis system, once alignment of the entire wafer has been completed, the wafer need only be caused to effect stepping in accordance with the arrangement of the chips and therefore, the exposure processing time is shortened. However, the alignment of each chip is not effected and therefore, satisfactory super-position accuracy has not always been obtained under the influence of the expansion and contraction of the wafer, the rotation error of the wafer on the stage, the degree of orthogonality of movement of the stage itself, etc.

The wafer alignment patterns typically include discrete areas on the semiconductor substrate, which are initially patterned to form multiple series of precisely configured parallel lines. In subsequent processing of the wafer, sometimes these wafer alignment patterns are masked such that they are not subjected to the specific processing, while other times they are left unmasked and are accordingly processed. For example, in some instances it is desirable to provide a planarized layer of a highly reflective or opaque material. Such a layer, because it is planarized, would not repeat the underlying pattern and substantially all incident light would be reflected away or absorbed. In such instance, the underlying alignment pattern would be lost. Accordingly in such instances, the wafer alignment pattern area would not be masked such that etching of such materials would not occur over the alignment patterns.

Where planarization does not occur or where a planarized layer is suitably light transmissive to reveal the underlying pattern, the wafer alignment areas are typically masked during processing. Not masking of the wafer alignment pattern area throughout processing is typically not desired, as such would adversely effect overall global planarity of the wafer and eventually result in the wafer alignment patterns being received in deep holes or caverns. This would adversely affect the utility of the patterns and lead to other wafer processing problems. For example, whether an alignment step is masked or not masked during a photo exposure depends on several factors. These include, 1) the ability to see the alignment step at the next photo step; 2) the impact on the rest of the wafer, such as cracking and planarity; and 3) consistency in being able to get good alignment at all subsequent photo-processing steps.

The increasing circuit density and vertical integration associated therewith has lead to increasing utilization of planarizing steps to assure an overall planar wafer which is easier to process. This, however, has placed difficult constraints upon photomask alignment relative to the wafers being processed. Specifically, contrasts provided by illuminating the wafer with incident light must rely in part upon differences in light intensity resulting from internal reflections off of a buried structure. This presents only minor problems for a single layer of surface planarized material, or for a stack of surface planarized transparent materials where each has a similar index of refraction and the underlying film has high reflectance. However where a stack of two planarized layers of different material having substantially different indexes of refraction is utilized, obtaining adequate contrast for ultimate wafer and photomask alignment becomes considerably more complex.

At present, there is no way to assure image placement of the first photomask layer with respect to the zero photomask layer, or global alignment mask. Hence it is not possible to check the overlay accuracy of the first photomask layer and non-correctable overlay errors occur at the second photomask layer. For example, if there is a trapezoidal error at the first mask layer (due to a faulty reticle or reticle stage), subsequent layers aligning to the first layer will exhibit complex overlay errors (high 3 sigma) which are difficult to compensate due to large residual errors.

A method of assuring accurate image placement of the first photomask so that subsequent layers would have greater overlay accuracy and minimal non-correctable overlay errors has been long sought but have equally long eluded those skilled in the art.

DISCLOSURE OF THE INVENTION

The present invention provides an exposure apparatus for a semiconductor wafer which includes a light source, a body containing the light source, and an illumination optical system for directing light from the light source to the semiconductor wafer. A holder in the body holds a reticle and a zero layer reticle is disposed between the illumination optical system and the light source for masking light from the light source. The zero layer reticle has a pellicle frame and a pellicle film with a zero layer image placement indicator thereon which when aligned with a box on a first layer image assures alignment among the zero layer reticle, the first layer reticle, and the semiconductor wafer.

The present invention further provides a zero layer reticle which has a pellicle frame and a pellicle film with a zero layer image placement indicator thereon which when aligned with a box on a first layer image assures alignment among the zero layer reticle, the first layer reticle, and the semiconductor wafer.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
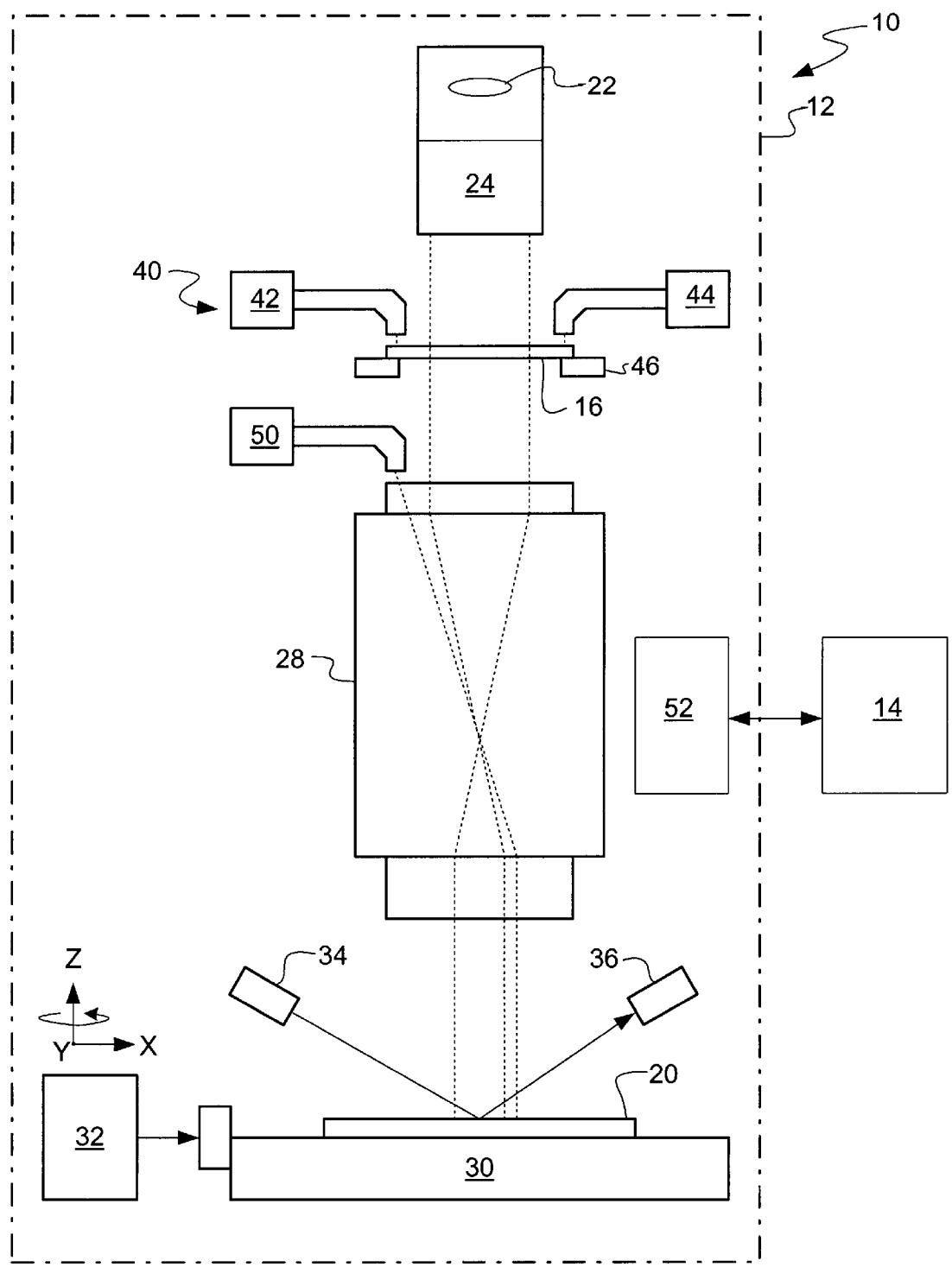
FIG. 1 is a exemplary exposure apparatus in which the present invention is applied.

Referring now to FIG. 1, therein is shown an exemplary exposure apparatus, e.g., a stepper 10 for manufacturing a semiconductor device in which the present invention is applied. FIG. 1 illustrates components in a main body 12 of the stepper and a console computer 14, which is operated by an operator, to control the operation of the stepper 10.

The stepper 10 uses a zero layer mask or a reticle 16 and having patterns for manufacturing a semiconductor device formed on its lower surface. Each of a plurality of exposure areas of a semiconductor wafer 20 is exposed to a projected, reduced image of the patterns on the reticle 16. The stepper 10 has an exposure light source 22 such as an ultrahigh-pressure mercury lamp or a KrF (ArF) excimer laser, and an illumination optical system 24 for illuminating the reticle 16 with exposure light from the exposure light source 22. The reduced images of the patterns on the reticle 16 illuminated with the exposure light from the exposure light source 22 by the illumination optical system 24 are projected upon the semiconductor wafer 20 by a reduction projection lens 28 representing a projection optical system to be printed in one of the plurality of exposure areas on the wafer 20.

A XY-stage 30 supports the wafer 20 and moves in a stepping manner in the X- or Y-direction each time the patterns of the reticle 16 are printed in one of the exposure areas on the wafer 20. The XY-stage 30 comprises a theta-Z-tilt stage for moving the wafer 20 in the Z-direction, parallel to the optical axis of the projection lens 28, for rotating the wafer 20 in the theta-direction about the Z-axis and for tilting the wafer 20 by rotation about the X- or Y-axis. A well-known laser interference type distance measuring device (laser interferometer) 32 is provided to measure a position on the XY-surface of the XY-stage 30. A focus detection system, including a projection system 34 and a light receiving system 36, is provided to detect the position of the wafer surface in the Z-direction from the focal plane of the projection lens 28 and to detect a tilt of the wafer surface with respect to the focal plane. The projection system 34 emits light to the wafer surface and the light receiving system 36 receives reflected light from the wafer surface. The position in the Z-direction and a tilt of the wafer 20 are detected by examining the position at which the reflected light is incident upon the light receiving system 36.

A through-the-reticle (TTR) alignment detection system 40, including units 42 and 44, is used to detect the positional relationship in an XY-plane between reticle setting marks (not shown) on the reticle 16 and reticle setting reference marks (not shown) provided on the stepper main body (ordinarily, on the lens barrel of the projection lens 28). Alignment of the reticle 16 is performed by using a reticle stage 46 on which the reticle 16 is supported and which can be moved in each of the X-, Y- and theta-directions along the XY-plane.

The TTR alignment detection system 40 is also used to detect alignment marks (not shown) on the wafer 20 through the reticle 16 and the projection lens 28. The TTR alignment detection system 40 detects a misalignment of the wafer 20 and/or each exposure area on the wafer 20 in a XY-plane. A non-TTR alignment system 50 is also provided. Only one unit of the non-TTR alignment system 50 is shown in FIG. 1 but another unit of the non-TTR alignment system 50 is provided 90° in the XY-plane from the one shown. The non-TTR alignment system 50 detects alignment marks on the wafer 20 through the projection lens 28 to detect a misalignment of the wafer 20 and/or each exposure area on the wafer 20 in the XY-plane.

A main central processing unit (CPU) 52 is provided for overall control of the stepper 10.

Figure 2:
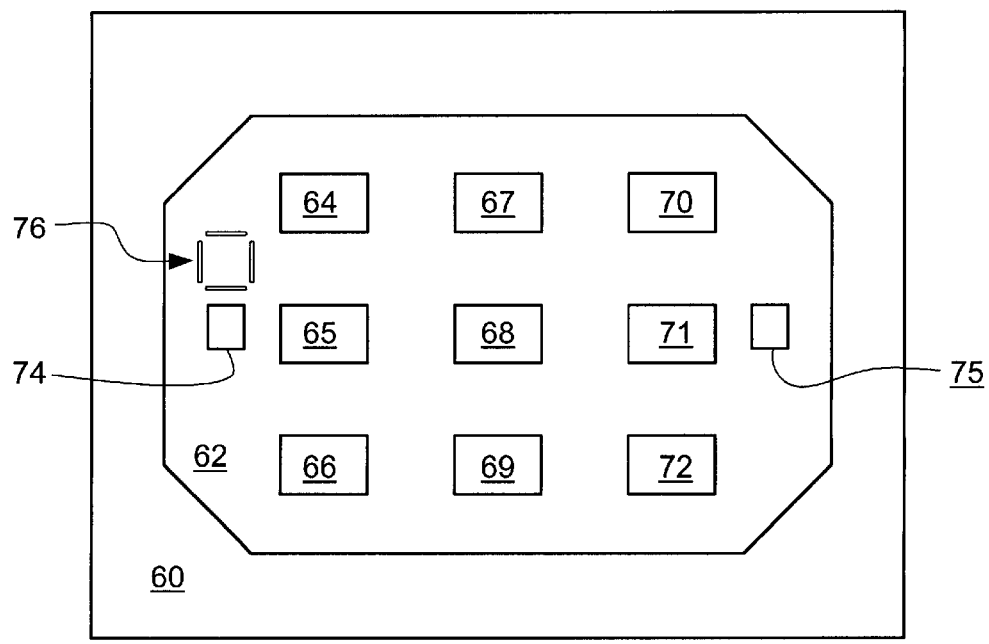
FIG. 2 is a reticle manufactured in accordance with the present invention.

Referring now to FIG. 2, therein is shown the reticle 16 having a pellicle frame 60 around a transparent pellicle film 62. The transparent pellicle film 62 contains image blocks 64 through 72 and clearout windows 74 and 75, which are chromeless (no chrome) windows for positive resist systems. A zero layer image placement indicator 76 of the present invention can be placed anywhere inside the pellicle frame 60 and outside the prime die area.

Figure 3:
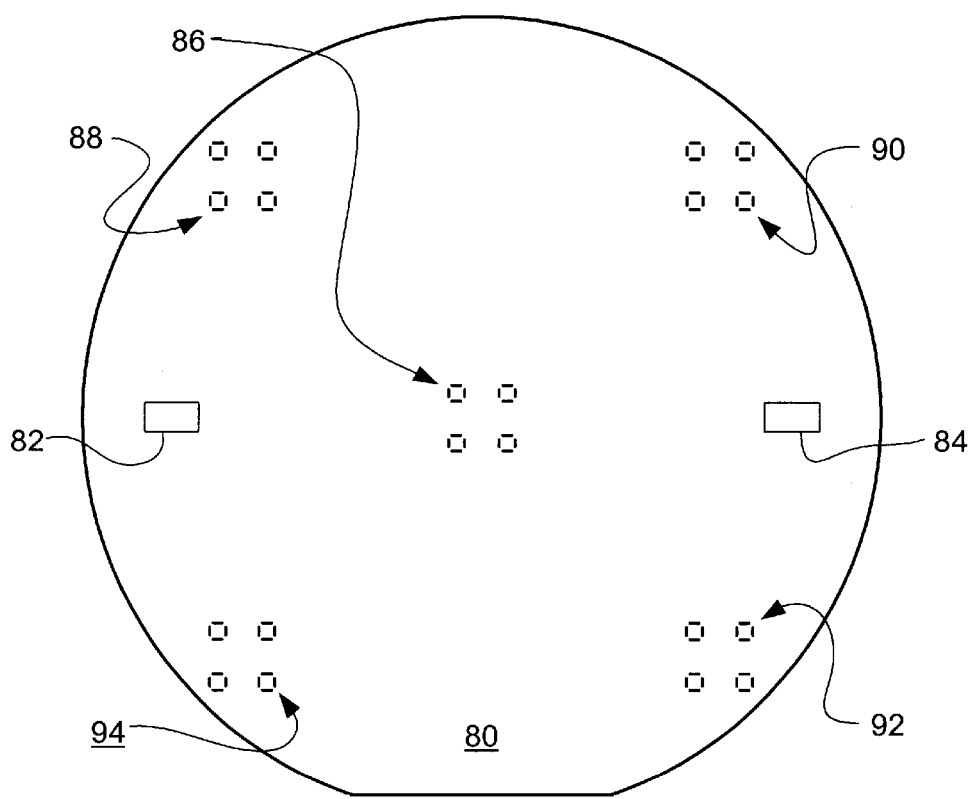
FIG. 3 is a semiconductor wafer manufactured in accordance with the present invention.

Referring now to FIG. 3, therein is shown a semiconductor wafer 80 having global alignment marks 82 and 84. A plurality of wafer zero layer image placement indicators 86, 88, 90, 92, and 94 are shown at different locations of the semiconductor wafer 80. The number and placement of the zero layer image placement indicators 86, 88, 90, 92, and 94 are heuristically determined to optimize alignment, and they are printed along with the global alignment marks 82 and 84 and are etched away to form permanent marks on the semiconductor wafer 80.

Figure 4:
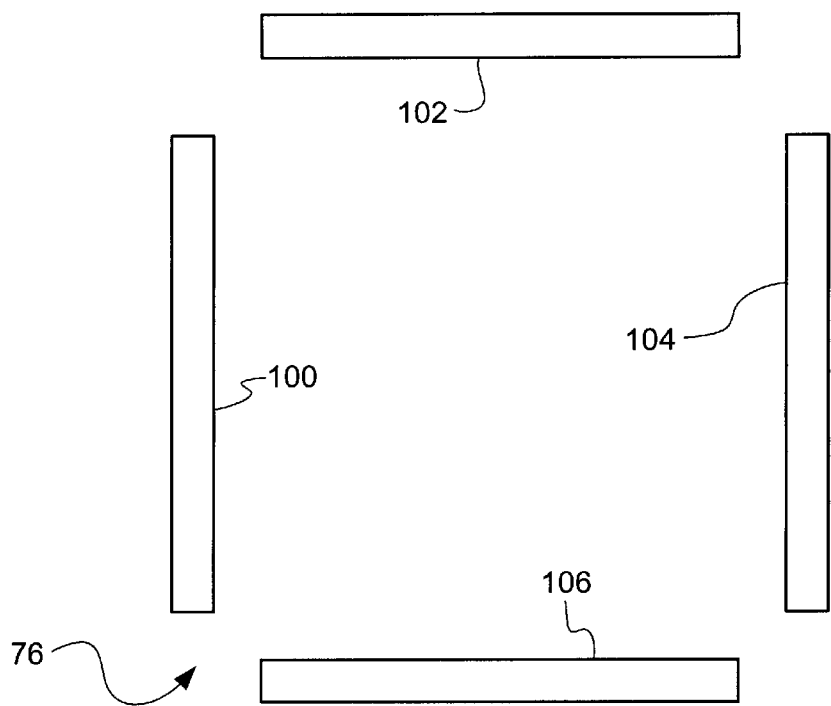
FIG. 4 is a closeup of the zero layer image placement indicator of the present invention.

Referring now to FIG. 4, therein is shown a close-up of the zero layer image placement indicator 76 which is made up of four rectangular overlay bars 100, 102, 104, and 106. The each of the four rectangular overlay bars 100, 102, 104, and 106 is positioned perpendicular to the one preceding it to surround a square or rectangular center. The polarity of the overlay bars 100, 102, 104, and 106 depends upon the resist type on the semiconductor wafer 80. For a positive resist process, these bars are chromeless such that the silicon substrate is etched away in a similar manner as the global alignment marks. The four rectangular overlay bars 100, 102, 104, and 106 are used rather than cross hairs because at the first mask box in bars will be formed to indicate image placement accuracy through box-in-bar overlay measurements.

It will be understood that the overlay bars can be placed in either in two or four corners of an image field and in as many fields as required for optimization of the overlay.

Figure 5:
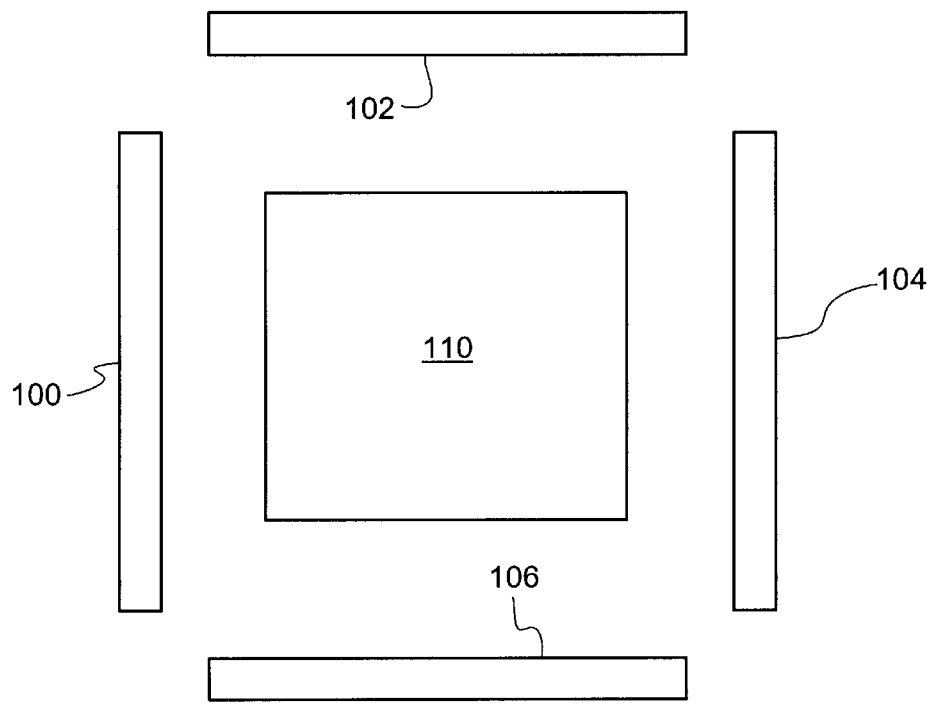
FIG. 5 is a properly located image of a first layer mask box over the zero layer image placement indicator.

Referring now to FIG. 5, therein is shown the properly located image of a first layer mask box 110 laid over the overlay bars 100, 102, 104, and 106. This properly located image will ensure accurate placement of the first layer mask image over the zero layer mask image on the semiconductor wafer 80 and of subsequent mask layers over the first layer mask image. This will result in minimal residual errors after subtracting the true non-correctable parameters, such as higher order lens distortions.

Further, typical problems with high trapezoidal errors (errors due to masks being at an angle to the wafer) due to first mask layer reticle dirt and contamination can be caught before production lots are run so scrap due to uncompensatable overlay errors at later mask levels can be avoided.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. An exposure apparatus for a semiconductor wafer comprising:

a light source;

a body containing the light source;

an illumination optical system for directing light from the light source to the semiconductor wafer;

a holder for holding a reticle; and a zero layer reticle disposed between the illumination optical system and the light source for masking light from the light source, the zero layer reticle having a pellicle frame and a pellicle film, the pellicle film having a zero layer image placement indicator thereon.

2. The exposure apparatus as claimed in claim 1 wherein the zero layer image placement indicator includes at least one bar.

3. The exposure apparatus as claimed in claim 2 wherein the zero layer image placement indicator includes a second bar perpendicular to the at least one bar.

4. The exposure apparatus as claimed in claim 3 wherein the zero layer image placement indicator includes a third bar perpendicular to the at least one bar.

5. The exposure apparatus as claimed in claim 4 wherein the zero layer image placement indicator includes a fourth bar parallel to the at least one bar.

6. The exposure apparatus as claimed in claim 5 wherein the zero layer image placement indicator has the first, second, third, and fourth bars around a box area.

7. The exposure apparatus as claimed in claim 6 wherein the zero layer reticle has chrome and chromeless areas, the zero layer image placement indicator is disposed in the chromeless area.

8. The exposure apparatus as claimed in claim 7 wherein the zero layer reticle has a clearout area, the zero layer image placement indicator is disposed proximate the clearout area.

9. The exposure apparatus as claimed in claim 8 including a first layer reticle having a pellicle film having a box thereon projected on the semiconductor wafer and wherein the first, second, third, and fourth bars are configured to fit around the box to indicate alignment among the zero layer reticle, the first layer reticle, and the semiconductor wafer.

10. A zero layer reticle for exposure apparatus comprising:

a pellicle frame; and pellicle film, the pellicle film having a zero layer image placement indicator thereon.

11. The zero layer reticle as claimed in claim 10 wherein the zero layer image placement indicator includes at least one bar.

12. The zero layer reticle as claimed in claim 11 wherein the zero layer image placement indicator includes a second bar perpendicular to the at least one bar.

13. The zero layer reticle as claimed in claim 12 wherein the zero layer image placement indicator includes a third bar perpendicular to the at least one bar.

14. The zero layer reticle as claimed in claim 13 wherein the zero layer image placement indicator includes a fourth bar parallel to the at least one bar.

15. The zero layer reticle as claimed in claim 14 wherein the zero layer image placement indicator has the first, second, third, and fourth bars around a box area.

16. The zero layer reticle as claimed in claim 15 wherein the zero layer reticle has chrome and chromeless areas, the zero layer image placement indicator is disposed in the chromeless area.

17. The zero layer reticle as claimed in claim 15 wherein the zero layer reticle has a clearout area, the zero layer image placement indicator is disposed proximate the clearout area.

* * * * *